(12) United States Patent
Fenk

(10) Patent No.: US 7,349,724 B2
(45) Date of Patent: Mar. 25, 2008

(54) RADIO FREQUENCY ARRANGEMENT AND PRODUCTION METHOD AND ALSO USE

(75) Inventor: Josef Fenk, Eching/Ottenburg (DE)

(73) Assignee: Infineon Technologies AG, Munich (DE)

( * ) Notice: Subject to any disclaimer, the term of this patent is extended or adjusted under 35 U.S.C. 154(b) by 526 days.

(21) Appl. No.: 11/038,848

(22) Filed: Jan. 19, 2005

(65) Prior Publication Data
US 2005/0192068 A1    Sep. 1, 2005

Related U.S. Application Data

(60) Provisional application No. 60/538,353, filed on Jan. 22, 2004.

(30) Foreign Application Priority Data
Jan. 22, 2004    (DE)    ....................... 10 2004 003 342

(51) Int. Cl.
    *H04M 1/00*     (2006.01)
    *H04B 1/10*     (2006.01)
    *H01Q 1/24*     (2006.01)

(52) U.S. Cl. ................... 455/575.5; 455/301; 455/280; 343/702; 343/841

(58) Field of Classification Search ............. 455/575.5, 455/575.7, 129, 280, 300, 301; 343/702, 343/841
See application file for complete search history.

(56) References Cited

U.S. PATENT DOCUMENTS

| | | | | |
|---|---|---|---|---|
| 5,564,083 | A | * | 10/1996 | Lee et al. ............... 455/575.7 |
| 5,731,964 | A | * | 3/1998 | Kitakubo et al. ........... 361/816 |
| 5,898,909 | A | * | 4/1999 | Yoshihara et al. .......... 455/73 |
| 6,031,494 | A | * | 2/2000 | Okabe et al. ............... 343/702 |
| 6,100,804 | A | | 8/2000 | Brady et al. |
| 6,521,978 | B2 | * | 2/2003 | Fenk et al. ................. 257/659 |
| 7,126,546 | B2 | * | 10/2006 | Annamaa et al. .......... 343/702 |
| 7,136,681 | B2 | * | 11/2006 | Sadler et al. ............ 455/575.1 |

(Continued)

FOREIGN PATENT DOCUMENTS

DE    34 14 480 A1    10/1985

*Primary Examiner*—Duc M. Nguyen
(74) *Attorney, Agent, or Firm*—Eschweiler & Associates, LLC

(57) ABSTRACT

A radio frequency arrangement includes a first semiconductor body having on a first side a radio frequency connection location for emitting therefrom or for supplying thereto a radio frequency signal, and a low frequency signal connection location for emitting therefrom or for supplying thereto a low frequency signal. The arrangement also includes a flexible antenna carrier having a first side and a second side with a metalized region formed as an antenna, wherein the metalized region has a radio frequency contact location on or in the first side of the antenna carrier, and wherein the first side of the antenna carrier and the first side of the first semiconductor body are arranged such that they face one another. In addition, the radio frequency contact location on or in the first side of the antenna carrier is coupled to the radio frequency connection location on the first side of the semiconductor body. Also, a second semiconductor body having on a main side a connection location for supplying thereto or emitting therefrom a signal is arranged with its main side on the second side of the antenna carrier, and wherein the connection location thereof is electrically coupled to the low frequency connection location of the first semiconductor body through the antenna carrier.

20 Claims, 3 Drawing Sheets

U.S. PATENT DOCUMENTS

| | | | |
|---|---|---|---|
| 7,164,898 B2 * | 1/2007 | Hankui et al. | 455/311 |
| 2003/0168725 A1 | 9/2003 | Warner et al. | |
| 2005/0201175 A1 * | 9/2005 | Fenk | 365/222 |

* cited by examiner

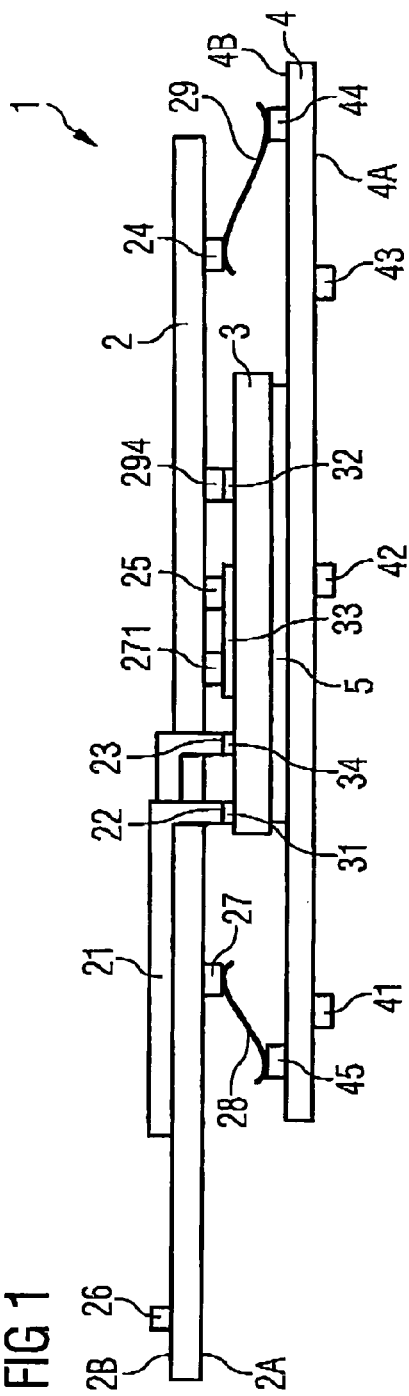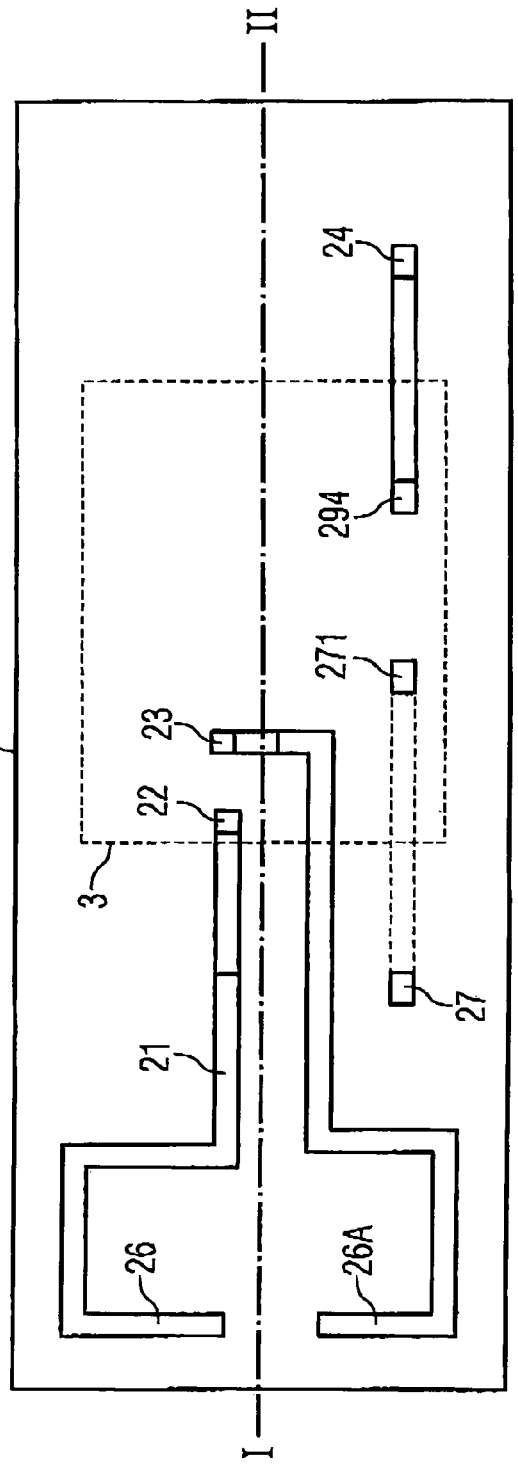

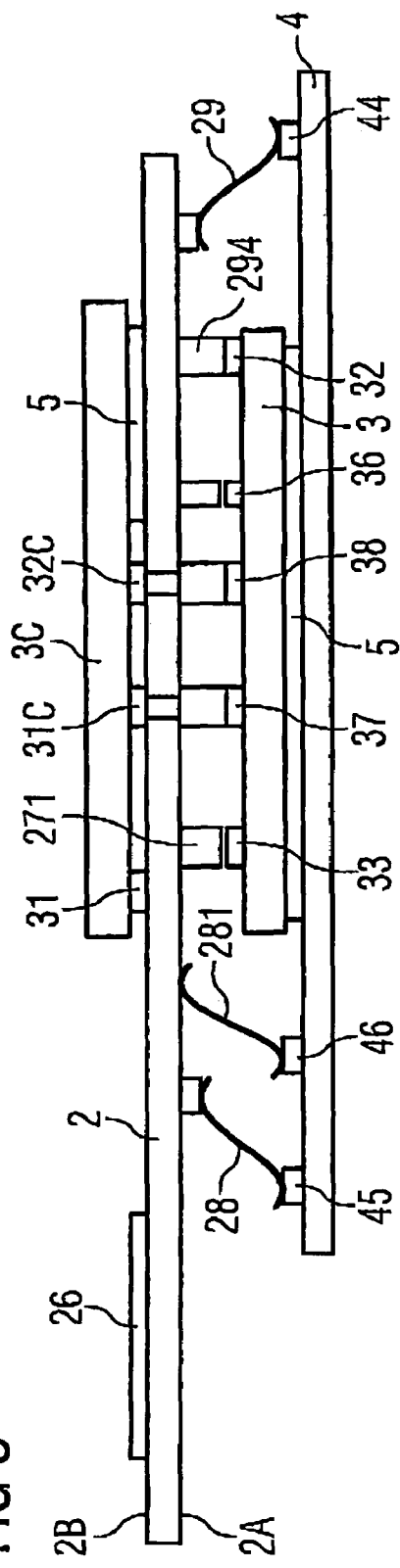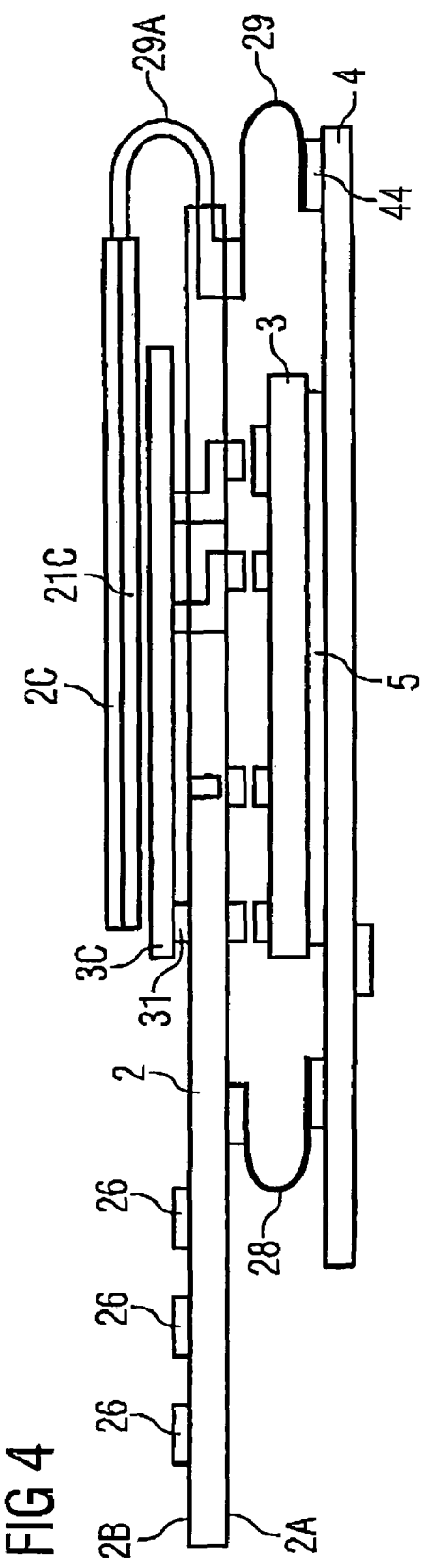

RADIO FREQUENCY ARRANGEMENT AND PRODUCTION METHOD AND ALSO USE

REFERENCE TO RELATED APPLICATION

This application claims the benefit of the priority date of German application DE 10 2004 003 342.0, filed on Jan. 22, 2004 and U.S. Provisional application 60/538,353 filed Jan. 22, 2004, the contents of which are herein incorporated by reference in their entirety.

FIELD OF THE INVENTION

The invention relates to a radio frequency arrangement. The invention furthermore relates to a method for producing such an arrangement and also to its use.

BACKGROUND OF THE INVENTION

Integrated radio frequency circuits have signal inputs and/or signal outputs for radio frequency signals, which are usually connected to external antennas. In previous radio frequency arrangements with antennas, the transmission and/or reception signals are passed via the connection locations on the surface of a semiconductor body containing the integrated circuit by means of bonding wires to signal lines of a circuit board, which, for their part, are connected to the external antenna. These connecting elements have a number of parasitic properties, for example capacitance with respect to ground, series inductance and series resistances. The additional transformation and signal losses that occur have to be compensated for, in the case of radio frequency transmitters, by an increased transmission power and thus a greater current or power requirement. A lower reception sensitivity that is likewise caused by the parasitic properties is compensated for in the reception path by particularly low-noise and sensitive, but more cost-intensive receiving amplifiers.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

the invention is directed to a radio frequency arrangement in which transmission losses are reduced and/or the reception sensitivity is increased. A method for producing such an arrangement and also a use of such an arrangement is also disclosed.

The radio frequency arrangement according to one embodiment of the invention comprises a semiconductor body with an integrated circuit formed therein, which has, on a first side thereof, a radio frequency connection location for emitting or for supplying a radio frequency signal. The arrangement furthermore comprises a flexible antenna carrier with a metalized region, which is formed as an antenna and contains a radio frequency connection location on a first side of the flexible antenna carrier. The first side of the flexible antenna carrier and the first side of the semiconductor body are arranged such that they face one another. The radio frequency connection location on the first side of the flexible antenna carrier is coupled to the radio frequency connection location on the first side of the semiconductor body.

As a result of the invention forming a flexible antenna carrier with an antenna integrated therein and arranging the radio frequency connection locations associated therewith such that they face one another, it is possible to save additional signal lines and thus to reduce parasitic capacitances, inductances and/or resistances. Signal losses are thereby reduced and the sensitivity to signals received via the antenna is improved.

In a preferred embodiment, the flexible antenna carrier is formed as a flexible laminate comprising a plurality of layers or plies, arranged one above the other, with at least one organic carrier layer. An organic carrier layer is understood to be a carrier material whose chemical composition contains a carbon compound. Preferred examples are flexible polyamide compounds or other polymers. Such a flexible laminate as a carrier is particularly flexible at least in partial regions, in which case the minimum bending diameter may amount to 5 times the thickness of the flexible antenna carrier.

A flexible laminate can be produced in many different embodiments. The simple production in turn enables a high degree of miniaturization. Forming a flexible antenna carrier in a flexible laminate technology is particularly advantageous since it is possible to realize significantly smaller connection areas for the metalized region. Together with a face-to-face technology, that is to say the arrangement of the two partial surfaces with the connection areas toward one another, only very small stray capacitances are generated at the connection locations. The term metalized region is preferably understood to be a thin metallic line layer.

The metalized region provided as an antenna is preferably formed as a split antenna. The antenna thus comprises a plurality of partial antennas whose common radiating characteristic, independently of the number of partial antennas, corresponds to a radiating characteristic of a single antenna. It is also referred to as a fractal antenna. In one embodiment, the metalized region formed as an antenna is formed on a second partial surface of the flexible antenna carrier. Said second partial surface is arranged opposite to the first side of the carrier. As an alternative, the metalized region formed as an antenna is formed within the flexible antenna carrier. In this embodiment, at least one further organic carrier layer is arranged on the two main surfaces of the metalized region.

In one exemplary embodiment of the invention, the flexible antenna carrier has a second metalized region, which is designed for shielding the semiconductor body against stray radio frequency signals. The second metalized region is preferably arranged within or on the flexible antenna carrier in such a way that it is situated above the semiconductor body. As a result, a cost-effective shielding measure against entering and/or emerging parasitic radio frequency radiation is implemented in a suitable manner. Further costly measures can thus be dispensed with. A coupling of the second metalized region to a ground potential is particularly advantageous in this case. Preferably, the second metalized region is also connected to the second surface of the semiconductor body.

In another embodiment of the invention, a carrier is fixed to a second partial surface opposite to the first partial surface of the semiconductor body. This carrier is expediently formed as a rigid carrier. In a development of this configuration, the carrier has at least one signal line for low-frequency signals. The signal line of the carrier is connected to a signal line of the flexible antenna carrier. The signal line of the flexible antenna carrier comprises a further connection location, coupled to a connection location of the semiconductor body. In this embodiment, in an expedient configuration, all the low-frequency signals are passed via signal lines on the carrier and then connected to the semiconductor body via signal lines in or on the flexible antenna carrier. The flexible antenna carrier with the additional signal lines is advantageously likewise formed by means of flexible laminate technology.

In one example, it is advantageous to form the coupling between the radio frequency connection location of the flexible antenna carrier and the radio frequency connection location of the semiconductor body by a suitable solder. A galvanic coupling is formed as a result. As an alternative, a coupling may also be effected by means of an inductive or capacitive coupling. In a further configuration, the connection locations of the flexible antenna carrier and of the semiconductor body are also connected by a solder. A solder which is particularly suitable for radio frequency signals is preferably used in this case. This may be a soft solder or else a hard solder. As an alternative, a connection may also be effected by means of a silver solder.

In another example, it is advantageous to form the radio frequency connection location on the flexible antenna carrier as a contact pad with a size of less than 70×70 μm and preferably with a size in the range of 10×10 μm to 30×30 μm. This particularly small connection area primarily reduces a parasitic capacitance with respect to the ground potential. Such connection locations of this order of magnitude can be produced with the aid of flexible laminate technology.

A method for producing a radio frequency arrangement according to one exemplary embodiment of the present invention comprises providing an integrated circuit in a semiconductor body, which has, on a first partial surface, at least one radio frequency connection location for emitting or supplying a radio frequency signal. The method also includes providing a flexible antenna carrier with a metalized region formed as an antenna thereon. A radio frequency connection of the metalized region is provided on a first partial surface of the flexible antenna carrier, and the first partial surface of the flexible antenna carrier and the first partial surface of the semiconductor body are arranged such that they face one another. The method further comprises coupling the radio frequency connection location of the flexible antenna carrier to the radio frequency connection location of the semiconductor body.

In one embodiment of the method according to the invention, providing a flexible antenna carrier comprises providing an antenna carrier which is produced in flexible laminate technology with at least one organic carrier layer. Preferably, the flexible antenna carrier is already formed with a metalized region provided as an antenna. This metalized region may be suitable on the flexible antenna carrier or within two organic carrier layers encompassing the metalized region. In an advantageous configuration, a thin metallic layer is provided as the metalized region.

In another embodiment, the partial surfaces of the semiconductor body and of the flexible antenna carrier are arranged with the aid of a face-to-face technology. Thus, the two partial surfaces are arranged such that they face one another in such a way that the connection areas lie one above the other.

One exemplary aspect of the method according to the invention is characterized by providing a connection location on the first partial surface of the semiconductor body. This is designed for emitting or for supplying a signal. Furthermore, provision is made of a signal line on or in the flexible antenna carrier with a connection location on the first partial surface of the flexible antenna carrier. The connection location of the semiconductor body is coupled to the connection location of the flexible antenna carrier. Moreover, the method includes providing a carrier with at least one signal line and fixing the carrier to a second partial surface of the semiconductor body. Finally, the signal line of the carrier is connected to the signal line of the flexible antenna carrier.

In a preferred embodiment of the method, the coupling of the connection locations or the coupling of the radio frequency connection locations is effected by providing a galvanic connection and preferably by applying a solder. Said solder connects the connection locations to one another.

Another aspect of the method comprises providing a second metalized region on the flexible antenna carrier, which is designed for shielding against radio frequency radiation. The second metalized region is coupled to a ground potential. As a result, one side of the semiconductor body is shielded from parasitic radio frequency radiation.

In one exemplary embodiment of the method, the metalized region formed as an antenna is formed as a split antenna with a plurality of partial antennas. The common radiating characteristic of the partial antennas corresponds to a single antenna, independently of the number of partial antennas. A metalized region formed as a fractal antenna is preferably provided on the flexible antenna carrier.

The arrangement according to the invention can be used, in particular, in a transmitting and/or receiving device of radio signals.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in detail below on the basis of various exemplary embodiments taking account of the drawings, thus:

FIG. 1 shows an exemplary embodiment of the invention,

FIG. 2 shows a second view of the exemplary embodiment of FIG. 1, the section of which through the plane I-II is shown in FIG. 1, FIG. 3 shows a second exemplary embodiment of the invention, FIG. 4 shows a third exemplary embodiment of the invention.

DETAILED DESCRIPTION OF THE INVENTION

Figure 5:
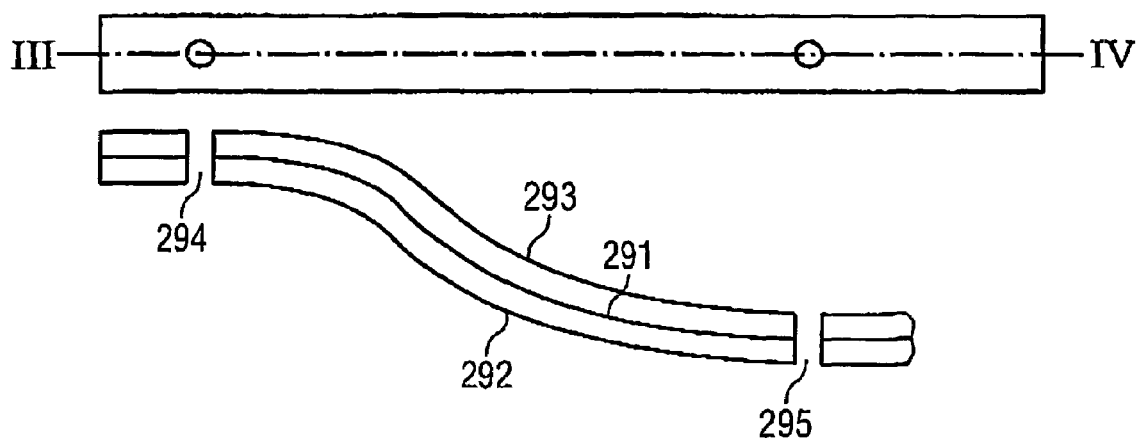
FIG. 5 shows a section through a flexible antenna carrier.

FIG. 1 shows a radio frequency arrangement according to the invention with an integrated circuit 3 for radio frequency signal processing, a flexible antenna carrier 2 and also a second, rigid carrier 4.

The integrated circuit 3 is accommodated in a semiconductor body having a plurality of connection locations 31, 32 and 33 at a first partial surface. Said connection locations are designed for supplying low-frequency signals and also for emitting a radio frequency signal. The flexible antenna carrier 2 facing the connection locations 31, 32 and 33 is formed in a flexible laminate technology and contains a plurality of organic carrier layers and also a plurality of mutually separate metalized regions, which form individual signal lines. The individual signal lines are arranged between individual organic carrier layers and are thus spatially separate from one another. The metalized regions are formed as thin copper layers or lines. An illustration within the antenna carrier 2 has been dispensed with for reasons of clarity.

A plurality of connection locations 22, 23, 271, 25 and 294 are situated on the underside 2A of the flexible antenna carrier 2 and, for their part, are connected to the various signal lines of the antenna carrier. In addition, the connection locations 22, 23, 271, 25 and 294 are arranged on the partial surface 2A of the antenna carrier in such a way that they in each case lie opposite a connection of the integrated circuit 3 on the partial surface of the semiconductor body and are galvanically connected thereto. The respective connection locations are formed as small connection pads having an area in the range of 10×10 to 30×30 μm. The electrical connection is effected by means of a solder applied during the production step.

A particular connection location is constituted by the connection pad 31 of the integrated circuit 3 on the partial surface of the semiconductor body and the connection contact 22—connected thereto—of the flexible antenna carrier 2. These are in each case formed as a radio frequency connection with a particularly small area size. A parasitic capacitance is reduced as a result. The connection 22 leads via a lead 21 to an antenna 26, which is formed as a partial antenna of a split or so-called fractal antenna. The connection contacts 34 and 23, which are connected to a second partial antenna 26A, are also formed in the same way. Fractal or split antennas are an amalgamation of a plurality of non-interconnected partial antennas. However, the spatial arrangement of the partial antennas among one another is chosen in such a way that the radiating characteristic is independent of the number of active partial antennas. In this way, it is possible to activate individual antenna branches when required, with the result that the radiating power is altered, but the radiating characteristic or the field distribution does not change.

Furthermore, a second partial surface of the semiconductor body opposite the first partial surface is connected to a rigid carrier 4 with the aid of an adhesive 5. The rigid carrier 4 constitutes a main circuit board that carries the necessary supply and control signals. For this purpose, the carrier 4 has a plurality of signal lines on the underside 41, 42 and 43 and also supply and ground potential lines (not illustrated) on the top side. The supply potential line comprises a connection location 45. The ground potential line has a connection location 44. These serve for supplying the integrated circuit 3 in the semiconductor body, which is illustrated below.

In order to make contact with the ground contact 32 and the supply potential contact 33, the flexible antenna carrier 2 comprises two particularly flexible regions 28 and 29 formed as contact fingers. Such a contact finger can be seen in detail in FIG. 5.

The excerpt illustrated in FIG. 5 contains in each case a plurality of organic carrier layers 292 and 293, between which a metalized region 291, preferably made of copper, is introduced as a signal line. This signal line is formed as a thin metallic strip. It is enclosed by the flexible carrier material formed in sandwich-type fashion and is situated at a position at which it is neither compressed nor expanded when bent as illustrated here. The line thus lies in the region of the "neutral zone". The organic carrier layers 292 and 293 additionally enable a sufficient insulation of the conductive copper layer 291. The carrier layers are made of a polyamide and/or further polymers. They are connected by means of an adhesive.

Circular holes are provided at two locations 294 and 295 in the present exemplary embodiment in accordance with FIG. 5, which holes form the connection contacts. In the exemplary embodiment, the connection hole 295 is situated above the connection contact 44 of the rigid carrier 4. A solder that fills the interspace or the hole 295 simultaneously produces a sufficient electrical connection between the conductive copper layer 291 and the connection contact 44 of the rigid carrier 4. A connection is achieved in the same way at the connection contact 294 and the ground potential connection 32 of the integrated circuit of the semiconductor body 3.

The flexible antenna carrier itself is also constructed in a similar manner. It contains a plurality of organic carrier layers, depending on stability requirements. The metalized regions 21, 26 and the signal lines are likewise formed as thin copper lines.

In this exemplary embodiment, the flexible antenna carrier 2 is thus additionally formed with the finger-type continuations 28 and 29 in order to pass low-frequency signals to the connection contacts at the top side 3A of the semiconductor body 3. At the locations 27 and 24, the organic carrier material of the continuations 28 and 29 merges with the carrier material of the antenna carrier 2.

FIG. 2 shows the top side of the arrangement of FIG. 1, which can be produced by a section in the plane I-II from FIG. 2. The metalized region formed as an antenna 21 is led on the top side of the flexible antenna carrier 2. A connection contact 22 and 23 is effected by means of a leadthrough of the metalized region through the antenna carrier material. The antenna is in this case formed as a split or fractal antenna. It comprises two individual antennas 26 and 26A whose common radiating characteristic has the same characteristic as an individual large antenna. Given a suitable design, individual antenna branches can be switched on and off separately depending on the desired radiating power without the radiating characteristic changing. The two antenna branches 26 and 26A illustrated in the exemplary embodiment, which are connected to the radio frequency connections 22 and 23, are additionally covered by a thin organic carrier layer that protects the metalized region from oxidation and mechanical damage but causes hardly any signal attenuation.

At the underside of the carrier material of the flexible antenna carrier 2, as indicated here by the dashed line, the connection 271 of the supply potential line is led to the point 27 and from there via a contact finger to the connection 45 of the rigid carrier 4. The same applies to the ground potential line, which is led from the connection 294 via the point 24 shown here to the connection pad 44 of the rigid carrier 4. Forming the flexible antenna carrier by means of a flexible laminate makes it possible to achieve a significantly higher degree of miniaturization, in particular also at the connection contacts. A wiring layout and the signal routing with the resultant losses can be determined prior to realization by means of suitable circuitry methods. By virtue of the fixed location of the signal lines, more precise statements about signal losses can thereby be attained, so that the integrated circuit can be dimensioned more easily.

Since, moreover, a plurality of wiring planes can also be realized within the flexible laminate, it is possible to subdivide an integrated circuit again into a low-frequency region and into a radio frequency region and to accommodate these in two different semiconductor bodies. The signals required for communication between the two integrated circuits are carried by lines within the flexible laminate.

Such an exemplary embodiment is shown in FIG. 3. Identical components bear identical reference symbols in this case. An illustration of the signal line within the antenna carrier 2 has been dispensed with for reasons of clarity. An integrated circuit 3 designed for signal processing of low-frequency signals is contained in the semiconductor body, which is fixed by means of an adhesive layer 5 on the rigid carrier 4. Contact fingers 28 and 29 with a flexible laminate technology connect the two supply potential connections 45 and 44 to the connection contacts 33 and 32 of the semiconductor body 3 via the connection areas 271 and 294. A further flexible contact finger 281 produced in flexible laminate technology connects the signal connection 46 on the top side of the rigid carrier 4 to the contact connection 36 of the integrated circuit 3 of the semiconductor body. The latter is supplied with a low-frequency signal which the integrated circuit 3 processes and forwards signals generated therefrom via the connections 37 and 38 to a second semiconductor body 3C containing an integrated circuit designed for radio frequency signal processing. The forwarding is effected via signal lines within the flexible antenna carrier 2 to two signal connections 31C and 32C, respectively, of the second integrated circuit 3C. The semiconductor body 3C is fixed on the partial surface 2B by means of an adhesive layer 5. Various signal lines can be carried by means of the flexible antenna carrier introduced between the two semiconductor bodies or chips. This obviates the need for contacts assigned to one another, in the face-to-face technology that is otherwise customary, to be fitted directly one above the other. In the exemplary embodiment illustrated here, forming the signal routing in flexible laminate technology therefore enables the use of integrated circuits in different semiconductor bodies with spatially different contact locations with respect to one another.

A radio frequency signal output 31 of the radio frequency circuit of the semiconductor body 3C is again coupled to the split or fractal antenna 21.

FIG. 4 shows a further exemplary embodiment, in which the flexible antenna carrier is additionally used for shielding against stray radio frequency radiation. For this purpose, a partial carrier 2C is provided, having a region 21C metalized in large-area fashion at the underside. A flexible contact finger 29A with a signal line integrated therein is connected to the metalized region and simultaneously leads to the flexible antenna carrier 2 and the contact finger 29 there, which is connected to the ground potential connection 44 of the rigid carrier 4. As a result, the metalized region 21C is always connected to the ground potential, as a result of which the integrated circuit in the body 3C, said integrated circuit being situated below the metalized region 21C, is protected against radio frequency interference radiation. At the same time, the radio frequency behavior is improved by the direct contact-connection of the metalized region 21C to the rear side of the semiconductor body 3C.

The radio frequency connection 31 of the semiconductor body 3C is furthermore connected to three partial antennas 26 formed as a fractal antenna.

When producing such an arrangement, the flexible antenna carrier including the required signal lines is produced after the provision of the two semiconductor bodies with precise knowledge of their respective connection areas. By virtue of the precise knowledge of the signal-carrying lines, the electrical properties of the antenna carrier can be simulated in a known manner as early as in the layout phase, and parasitic effects of the signal lines can thus be minimized. The carrier is realized by various polymer layers laid one above the other. The signal lines may be implemented for example by vapor-deposited copper layers. The flexible antenna carrier is therefore produced in known flexible laminate technology in various ways depending on the requirements.

In this case, the connection areas on the flexible antenna carrier are positioned relative to one another in such a way that they cover the respective connection areas on the semiconductor body. A simple contact-making by means of a solder is possible as a result. Moreover, a metalized region is also provided in this phase, which metalized region is then formed as an antenna depending on the respective requirement.

The arrangement is effected in face-to-face technology, with the result that additional bonding wires can be completely dispensed with. It is possible, by means of suitable signal routing as early as in the design phase and the production of the flexible antenna carrier, to nevertheless effectively electrically connect different integrated circuits to connection areas arranged differently. The short signal lines within the flexible antenna carrier and the known spatial distribution make it possible to reduce parasitic properties.

Precisely in the case of many wirefree low-power applications, for example wirefree microphones or radio-controlled sensors, which additionally impose a stringent requirement on the lifetime of the device and are at the same time cost-sensitive, the use of a flexible antenna carrier by means of a flexible laminate technology in combination with a face-to-face technology affords a cost-effective solution. Furthermore, the arrangement according to the invention can also be used for smart cards. The exemplary embodiments illustrated here can be realized with various types of flexible carrier materials. The radio frequency signal routing is in this case effected via the flexible carrier material. A rigid carrier as a main circuit board, which is used with a very inexpensive material, now merely contains the supply and control signals.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A radio frequency arrangement, comprising:
   a first semiconductor body comprising a circuit having on a first side a radio frequency connection location for emitting therefrom or for supplying thereto a radio frequency signal, and a low frequency signal connection location for emitting therefrom or for supplying thereto a low frequency signal;
   a flexible antenna carrier comprising a first side and a second side, and comprising a metalized region formed as an antenna, wherein the metalized region comprises a radio frequency contact location on or in the first side of the antenna carrier, and wherein the first side of the antenna carrier and the first side of the first semiconductor body are arranged such that they face one another, and further wherein the radio frequency contact location on or in the first side of the antenna carrier is coupled to the radio frequency connection location on the first side of the semiconductor body; and
   a second semiconductor body comprising a circuit having on a main side a connection location for supplying thereto or emitting therefrom a signal, wherein the second semiconductor body is arranged with its main side on the second side of the antenna carrier, and wherein the connection location thereof is electrically coupled to the low frequency connection location of the first semiconductor body through the antenna carrier.

2. The radio frequency arrangement of claim 1, wherein the flexible antenna carrier comprises a flexible laminate having at least one organic carrier layer.

3. The radio frequency arrangement of claim 1, wherein the metalized region formed as an antenna is formed on the second side of the flexible antenna carrier opposite to the first side.

4. The radio frequency arrangement of claim 1, wherein the metalized region comprises at least two partial regions formed as spatially separate partial antennas, wherein a common radiating characteristic of the at least two partial antennas corresponds to a radiating characteristic of a single antenna.

5. The radio frequency arrangement of claim 1, wherein the flexible antenna carrier comprises a second metalized region facing a second side of the first semiconductor body, and configured to shield the first semiconductor body against stray radio frequency signals.

6. The radio frequency arrangement of claim 5, wherein the second metalized region is coupled to a ground potential.

7. The radio frequency arrangement of claim 1, further comprising a rigid carrier fixed to a second side opposite to the first side of the first or the second semiconductor body.

8. The radio frequency arrangement of claim 7, wherein the rigid carrier comprises at least one signal line for supplying thereto or emitting therefrom a signal, wherein the at least one signal line is connected to a signal line of the flexible antenna carrier, the signal line of the flexible antenna carrier having a connection location coupled to a connection location of the first or the second semiconductor body.

9. The radio frequency arrangement of claim 1, wherein the coupling between the radio frequency contact location or the connection location of the flexible antenna carrier and the radio frequency connection location or the connection location of the first semiconductor body comprises a solder.

10. The radio frequency arrangement of claim 1, wherein the radio frequency contact location or the connection location on or in the first side of the flexible antenna carrier comprise pads with an area in the range of about 10 μm*10 μm to 30 μm*30 μm.

11. A method of producing a radio frequency arrangement, comprising:
    providing a first semiconductor body having on a first side thereof at least one radio frequency connection location for emitting therefrom or supplying thereto a radio frequency signal and also a low frequency connection location;
    providing a second semiconductor body having on a first side thereof a connection location for emitting therefrom or supplying thereto a signal;
    providing a flexible antenna carrier comprising a metalized region formed as an antenna thereon, the flexible antenna carrier further comprising a radio frequency contact location on a first side thereof;
    arranging the first side of the flexible antenna carrier and the first side of the first semiconductor body such that they face one another;
    coupling the radio frequency contact location of the flexible antenna carrier to the radio frequency connection location of the first semiconductor body;
    arranging the first side of the second semiconductor body and a second side of the antenna carrier with respect to one another; and
    coupling the connection location on the first side of the second semiconductor body to the low frequency connection location on the first side of the first semiconductor body through the antenna carrier.

12. The method of claim 11, further comprising:
    providing a connection location on the first side of the first or second semiconductor body for emitting therefrom or supplying thereto a signal to a circuit associated therewith;
    providing a signal line on or in the flexible antenna carrier with a connection location on the first or second side of the flexible antenna carrier;
    coupling the connection location of the second semiconductor body to the connection location of the flexible antenna carrier;
    providing a rigid carrier having at least one signal line and a connection location;
    fixing the rigid carrier to a second side of the first or the second semiconductor body; and
    connecting the connection location of the signal line of the rigid carrier to the signal line of the flexible antenna carrier.

13. The method of claim 11, wherein the coupling is effected by providing a galvanic connection by applying a solder.

14. The method of claim 11, further comprising:
    providing a second metalized region on or in the flexible antenna carrier, the second metalized region configured to shield against electromagnetic radiation; and
    coupling the second metalized region to a ground potential.

15. The method of claim 11, wherein providing the metalized region comprises applying a thin metallic layer on a region of the flexible antenna carrier.

16. A radio frequency arrangement, comprising:
    a radio frequency chip having on a first side thereof a radio frequency contact for emitting therefrom or supplying thereto a radio frequency signal, and a low frequency contact for emitting therefrom or supplying thereto a low frequency signal;

a flexible antenna carrier comprising a first side facing the first side of the radio frequency chip and a second, opposing side, wherein on one of the first or second side thereof a metallization forming an antenna resides, the flexible antenna carrier further comprising a radio frequency contact on the first side at a location thereof associated with a location of the radio frequency contact of the radio frequency chip; and a low frequency chip having on a first side facing the second side of the flexible antenna carrier a low frequency contact for supplying thereto or emitting therefrom a low frequency signal, wherein the low frequency contact of the low frequency chip resides at a location on the first side that is associated with a location of the low frequency contact of the radio frequency chip, and wherein the low frequency contact of the low frequency chip and the radio frequency chip are electrically coupled together through the flexible antenna carrier.

17. The radio frequency arrangement of claim 16, wherein the flexible antenna carrier comprises an electrical contact extending therethrough from the first side to the second side thereof, and wherein the low frequency chip and the radio frequency chip are arranged with respect to one another such that the low frequency contacts associated therewith are directly facing one another at the electrical contact of the flexible antenna carrier.

18. The radio frequency arrangement of claim 16, wherein the antenna metallization comprises two separate metallizations that are independently actuable, and wherein the two metallizations are partial antenna having a common radiating characteristic.

19. The radio frequency arrangement of claim 16, further comprising:

a rigid carrier having a first side facing and adhered to the second side of the low frequency chip, wherein the rigid carrier has supply and ground potential contacts on the first side thereof facing the second side of the flexible antenna carrier; and flexible conductive regions respectively coupled between the supply and ground potential contacts of the rigid carrier and corresponding supply and ground potential contacts on the second side of the flexible antenna carrier at a location adjacent to the low frequency chip.

20. The radio frequency arrangement of claim 19, further comprising a partial carrier having a first side facing a second side of the radio frequency chip, wherein the partial carrier comprises a metallization electrically coupled to ground potential that operates to shield the radio frequency chip from stray radiation.

* * * * *